United States Patent
Zhong et al.

(10) Patent No.: US 8,524,511 B1
(45) Date of Patent: Sep. 3, 2013

(54) METHOD TO CONNECT A MAGNETIC DEVICE TO A CMOS TRANSISTOR

(75) Inventors: Tom Zhong, Saratoga, CA (US); Vinh Lam, Roseville, CA (US); Zhongjian Teng, Santa Clara, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 13/571,675

(22) Filed: Aug. 10, 2012

(51) Int. Cl.
*H01L 21/00* (2006.01)

(52) U.S. Cl.
USPC ......... 438/3; 438/637; 257/421; 257/E29.323

(58) Field of Classification Search
USPC ............. 438/666, 637, 3, 57; 257/252, 225, 257/457, E33.066, E29.013, 108, 421, E29.323
See application file for complete search history.

(56) References Cited

U.S. PATENT DOCUMENTS

| | | | |
|---|---|---|---|
| 7,445,943 B2 * | 11/2008 | Smith et al. | 438/3 |
| 7,741,688 B2 | 6/2010 | Kajiyama | |
| 7,884,433 B2 | 2/2011 | Zhong et al. | |
| 7,943,505 B2 * | 5/2011 | Rhodes et al. | 438/622 |
| 7,999,246 B2 | 8/2011 | Iwayama | |
| 8,133,745 B2 | 3/2012 | Zhong et al. | |
| 2007/0069296 A1 | 3/2007 | Park et al. | |
| 2011/0073917 A1 | 3/2011 | Zhong et al. | |
| 2011/0101478 A1 * | 5/2011 | Zhong et al. | 257/421 |
| 2011/0148497 A1 * | 6/2011 | Ishii | 327/210 |
| 2011/0268992 A1 * | 11/2011 | Zhang et al. | 428/811.1 |
| 2012/0087180 A1 * | 4/2012 | Mani | 365/158 |

* cited by examiner

*Primary Examiner* — Jarrett Stark
*Assistant Examiner* — Shahed Ahmed
(74) *Attorney, Agent, or Firm* — Saile Ackerman LLC; Stephen B. Ackerman

(57) ABSTRACT

A CMOS device is provided in a substrate. A magnetic tunnel junction (MTJ) is provided over the CMOS device and connected to the CMOS device by a metal ring contact wherein a dielectric or other filling material forms the center of the metal ring contact and wherein a bottom of the metal ring contact underlying said filling material is metal.

20 Claims, 6 Drawing Sheets

METHOD TO CONNECT A MAGNETIC DEVICE TO A CMOS TRANSISTOR

TECHNICAL FIELD

This disclosure is related to Magnetic Devices, and more particularly, to methods of integrating Magnetic Devices with semiconductor devices.

BACKGROUND

Magnetoresistive random access memory (MRAM) is now a proven nonvolatile memory technology with many advantages over other commercialized memory types in areas such as write/read speed, power consumption, lifetime, etc. However, conventional MRAM has a fundamental limitation of scalability. In a newer design of MRAM, a spin transfer switching technique (STT) can be used to manipulate the memory element as well. This new design will allow better packing and shrinkage of individual magnetic tunneling junction (MTJ) devices on the wafer, effectively increasing the overall density of the MRAM memory elements. STT MRAM not only possesses the major benefits of conventional MRAM but also has tremendous potential for scalability. Unlike conventional MRAM that requires a separated word line in addition to a BIT line to switch the magnetization direction of the free layer (FL), STT MRAM relies on only a current passing through a MTJ junction to rotate the magnetization direction of the free layer (FL). In order for STT MRAM to switch a bit, however, the current density passing through the MTJ device should be larger than a critical switching current density (Jc). Since current density is inversely proportional to device physical size given a fixed amount of current, the switching efficiency increases as the critical dimension (CD) size of MTJ junction decreases. Thus, CD is normally very small for STT MRAM (typically <100 nm). In our previous disclosures (U.S. Pat. No. 7,884,433, U.S. Pat. No. 8,133,745, and U.S. patent application Ser. No. 12/586,900), all incorporated herein in their entirety, we revealed our methods to address many challenges for STT memory device fabrication.

MRAM devices are often combined with complementary metal-oxide-semiconductor (CMOS) devices. Process integration involves connection between MRAM and CMOS elements without causing any defect related issues.

U.S. Patent Application 2007/0069296 to Park et al describes a deep via contact from CMOS to MRAM. U.S. Pat. No. 7,999,246 to Iwayama and U.S. Patent Application 2008/0089118 to Kajiyima show ring-shaped magnetic junction elements.

SUMMARY

It is the primary objective of the present disclosure to provide a new integration method to connect a magnetic tunneling junction to a transistor that provides improved magnetic performance.

It is another objective of the present disclosure to provide an improved method for process integration of MRAM and CMOS devices that provides improved magnetic performance, including better thermal stability and lower offset magnetic field ($H_0$).

It is a further objective to provide an improved method for fabricating MRAM and CMOS devices connected by a contact ring.

It is a yet further objective to provide a magnetic device connected to a CMOS transistor by a contact ring.

In accordance with the objectives of the present disclosure, a method of fabricating an integrated spin-torque-transfer magnetic random access memory and CMOS device is achieved. A metal contact to a CMOS device is provided in a substrate. The metal contact is covered with a dielectric layer. A via is opened in the dielectric layer thereby exposing the metal contact. A metal ring contact is formed in the via wherein a filling layer is formed in a center of the metal ring and wherein a bottom of the metal ring contact underlying the filling layer is metal. A magnetic tunnel junction (MTJ) structure is provided over the metal ring contact and a bit line is formed over the MTJ.

Also in accordance with the objectives of the present disclosure, a spin-torque-transfer magnetic random access memory device having excellent thermal stability is achieved. A CMOS device is provided in a substrate. A magnetic tunnel junction (MTJ) is provided over the CMOS device and connected to the CMOS device by a metal ring contact wherein a dielectric or other filling material forms the center of the metal ring contact and wherein a bottom of the metal ring contact underlying the filling material is metal.

BRIEF DESCRIPTION OF THE DRAWINGS

In the accompanying drawings forming a material part of this description, there is shown.

DETAILED DESCRIPTION

Figure 1:
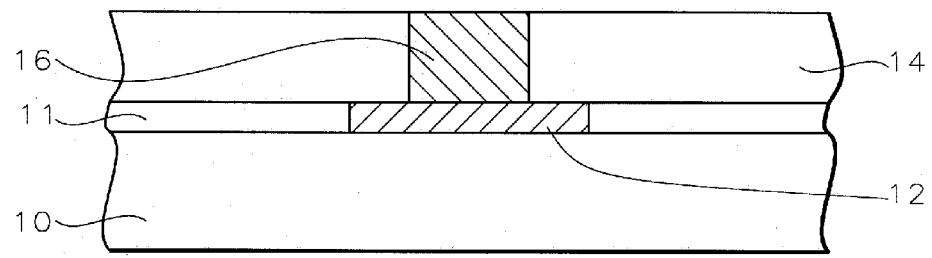
FIGS. 1-10 are cross-sectional representations of steps in a preferred embodiment of the present disclosure.

The present disclosure is a process integration method of fabricating MRAM devices and especially, high-density spin-transfer torque MRAM (STT MRAM) devices, connected to CMOS transistors. A ring-contact is created for connection between a CMOS transistor and a magnetic junction. This method allows one to build a magnetic device on top of a dielectric material or other special materials with benefits to magnetic performance. This method particularly provides a high thermal stability and a lower offset magnetic field ($H_0$). $H_0$ equals zero when the magnetic field to switch a magnetic layer from the parallel state to the anti-parallel state equals the magnetic field required to switch the same layer from the anti-parallel state to the parallel state Referring now more particularly to FIGS. 1-10, the method of the present disclosure will be described in detail. FIG. 1 illustrates a substrate 10. CMOS devices (not shown) are formed within the substrate. The topmost metal level 12 of one CMOS device structure is shown, surrounded by dielectric layer 11. The metal layer 12 may be copper, for example. The metal layer will serve as a metal landing pad 12 for a magnetic tunnel junction (MTJ). It will be understood that many CMOS devices and MRAM devices may be formed, but only one will be shown in the drawings.

Now, the magnetic RAM layers will be formed over the CMOS layers. A dielectric layer 14 is coated over the CMOS metal pad 12. A contact metal via 16 is created to the landing pad 12, for example, by a single Cu damascene method.

Figure 2:
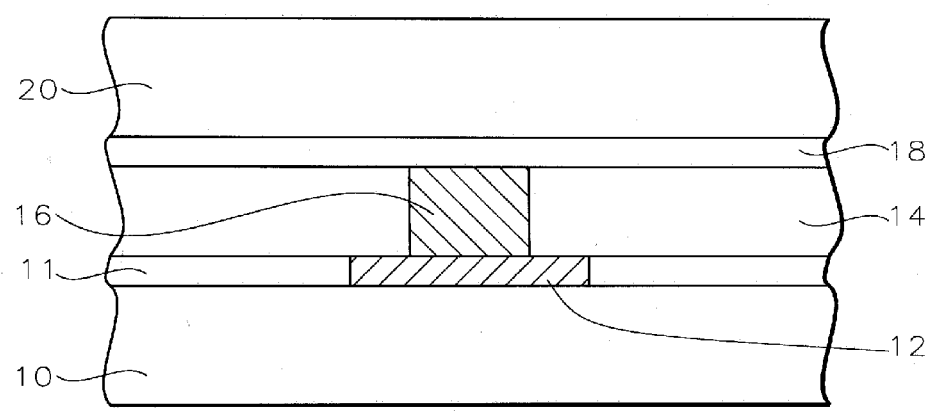

Referring now to FIG. 2, a double dielectric layer is deposited over the contact via 16. For example, a first dielectric layer 18 may be a silicon nitride layer having a thickness of between about 300 and 500 Angstroms. A second dielectric layer 20 may be a silicon dioxide layer having a thickness of between about 1000 and 3000 Angstroms. Copper is usually used as the interconnect metal 16. Layer 18 normally serves as an etch stop for layer 20 and as a copper diffusion barrier. If layer 16 is not copper, layers 18 and 20 could instead be a single dielectric layer.

Figure 3:
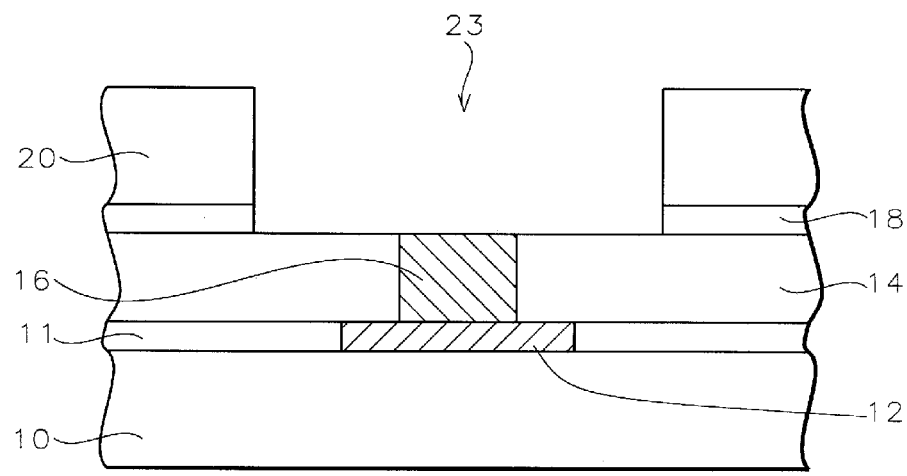

Referring to FIG. 3, a via is now patterned into the double dielectric layer to provide an opening 23 to the contact via 16. The size of the opening 23 will be determined by the size of the MTJ 38 in FIG. 8. It is preferred that the opening 23 is larger than the size of the MTJ 38.

Figure 4:
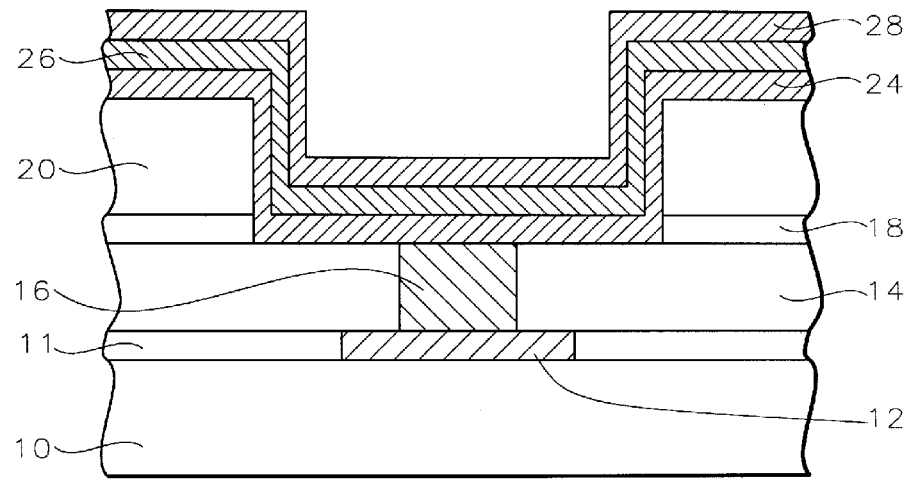

Now, a single or multi-layer metal film is deposited into the opening 23. The thickness of the deposited metal film or film stack should be thinner than the total dielectric film thickness of layers 18 and 20. The thickness difference is preferred to be larger than 1000 Angstroms for the later chemical mechanical polishing (CMP) process window. For example, FIG. 4 illustrates a three-layer metal film stack with a tantalum layer 24, copper-layer 26 and tantalum layer 28.

Figure 5:
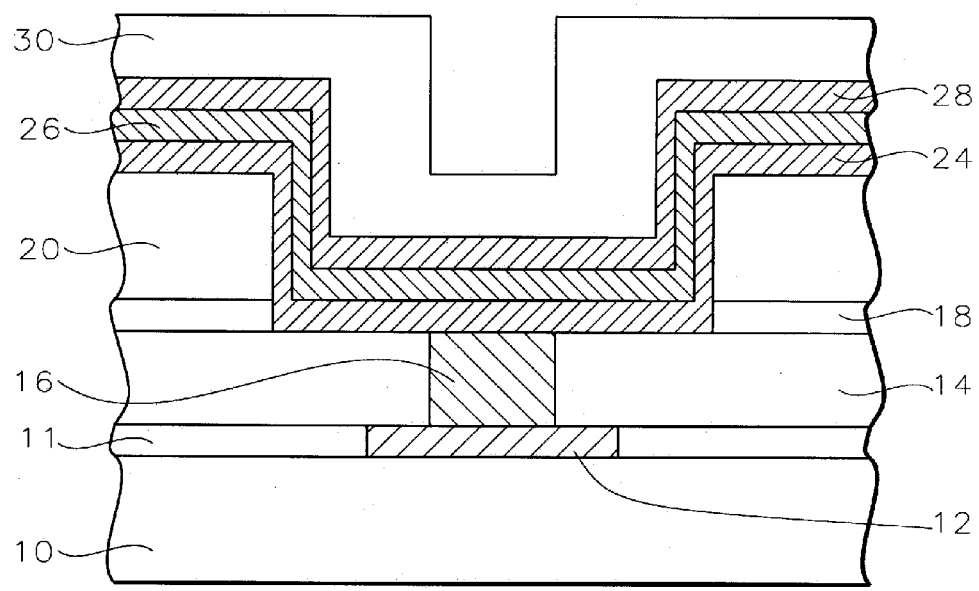

Next, as shown in FIG. 5, another dielectric film 30 is deposited over the topmost metal film 28. Preferably, the thickness of the film 30 will be between about 450 and 550 Angstroms. It is preferred that the top surface of 30 inside the filled via is equal to or higher than dielectric layer 20. Film 30 can be chemical vapor deposited (CVD) dielectric materials or spin-on dielectric, metal, or alloy materials. The requirements for the selection of this material are: 1) Good fillability inside the via, and 2) good CMP capability.

Figure 6:
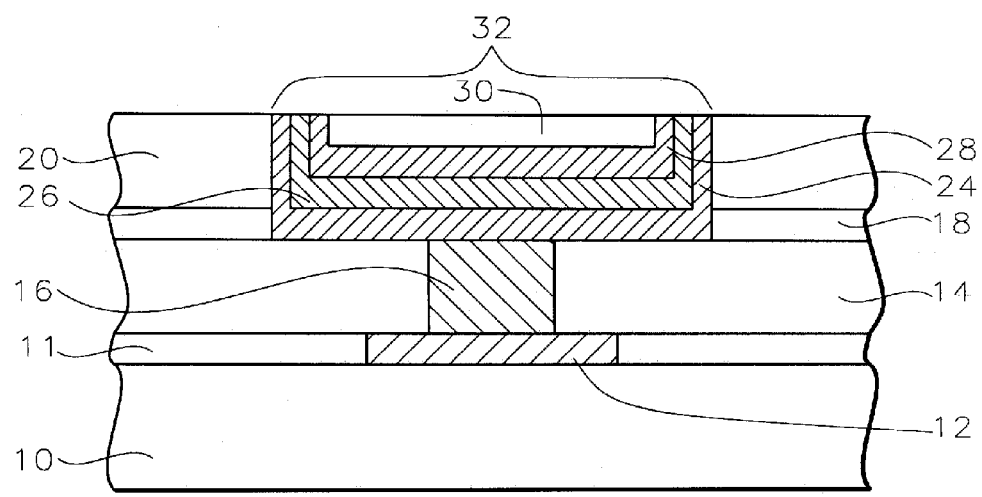
Figure 12:
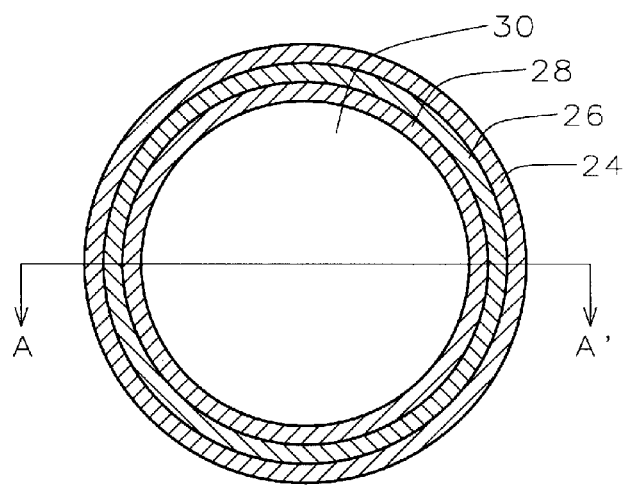
FIG. 12 is a top view of the cross-section A-A' in FIG. 6.

Now, a CMP process is performed to polish the dielectric layer 30 and the metal films 24/26/28. As shown in FIG. 6, the CMP endpoint should be after the metal films on the wafer are fully removed except inside the via opening 23, but before touching the metal films on the bottom of the via. After this CMP step, a ring-shaped contact is formed. FIG. 12 shows the top view of the ring-shaped contact comprised of the metals 24/26/28 with the film 30 filling the center of the ring. FIG. 6 is the cross-section A-A' of FIG. 12.

Figure 7:
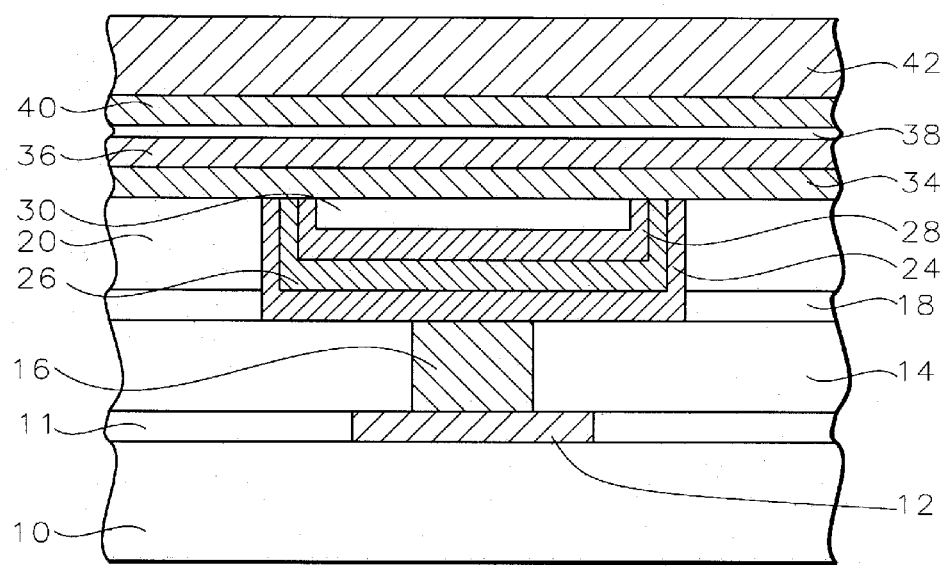

Now, the wafer is ready for the deposition of the MTJ stack of layers, as illustrated in FIG. 7. The present disclosure encompasses a variety of configurations including bottom spin valve, top spin valve, and dual spin valve structures, and so on. Preferably, the MTJ stack has an uppermost capping layer comprised of a hard mask. In one embodiment, for example, the MTJ stack has a bottom spin valve configuration in which seed/buffer layer 34, pinned layer or layers 36, barrier layer 38, free layer 40, and cap and hard mask layers 42 are sequentially formed on the contact ring 32.

Figure 8:
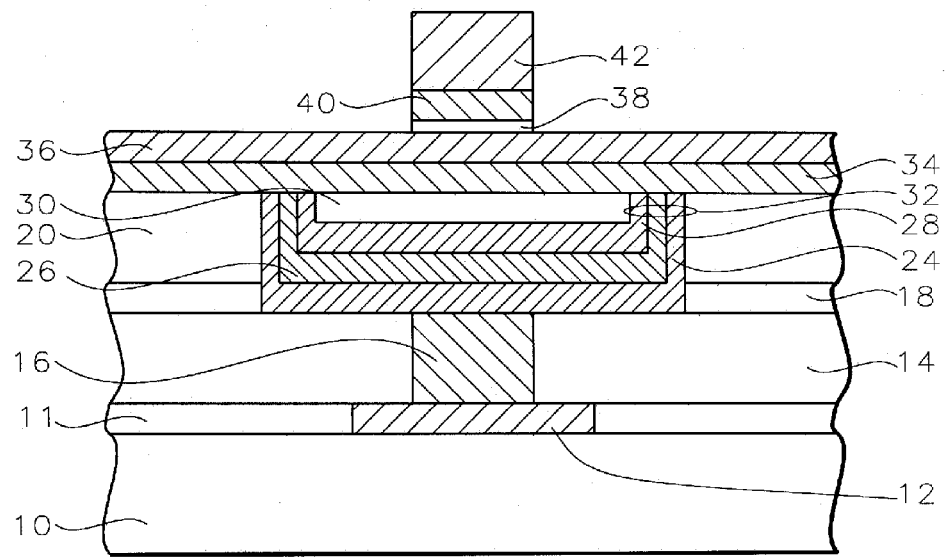

The MTJ stack is patterned by a process that includes at least one photolithography step and one etching step to form a MTJ element. In one embodiment, when two lithography processes are employed to define the MTJ element, a top portion of the MTJ may have a narrower width and smaller area size from a top view than a bottom portion of the MTJ. For example, FIG. 8 shows a first step of patterning the MTJ free layer where the etch is stopped at or before the pinned layer 36.

Figure 9:
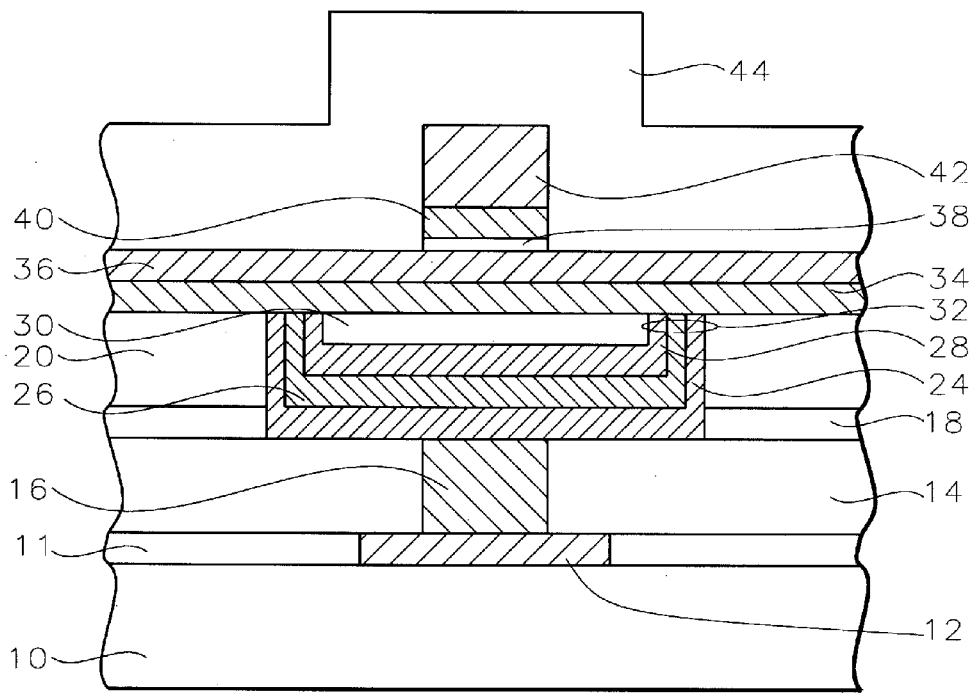
Figure 10:
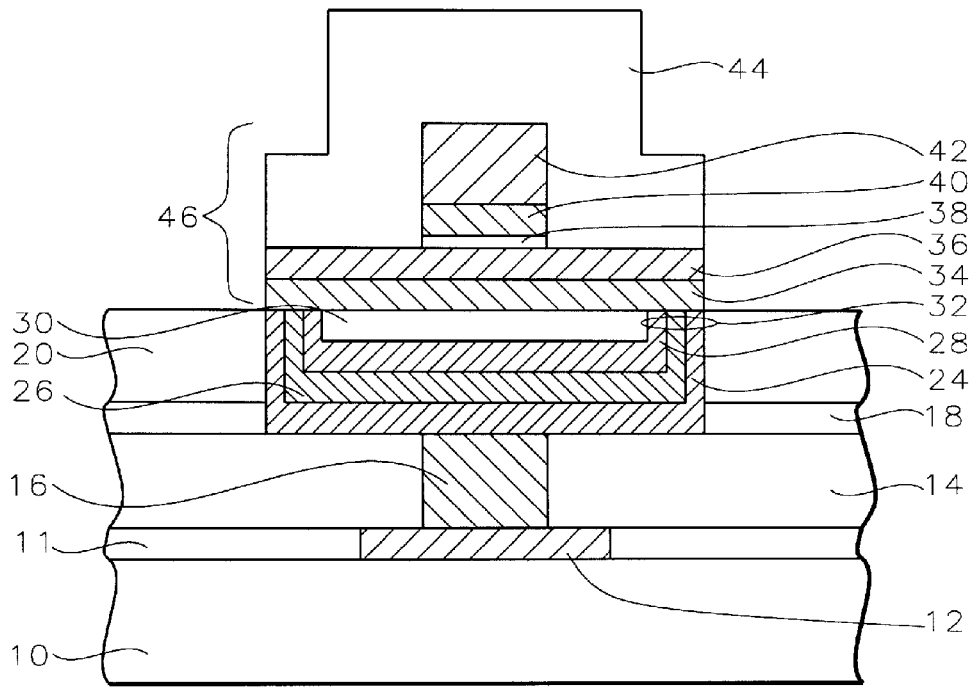

Then, in FIG. 9, a protective dielectric layer 44 is deposited over the MTJ stack. Next, the pinned layer is patterned, as shown in FIG. 10. The size of the pinned layer pattern must be large enough to create conduction between the pinned layer metal 34 and the contact ring 32.

Figure 11:
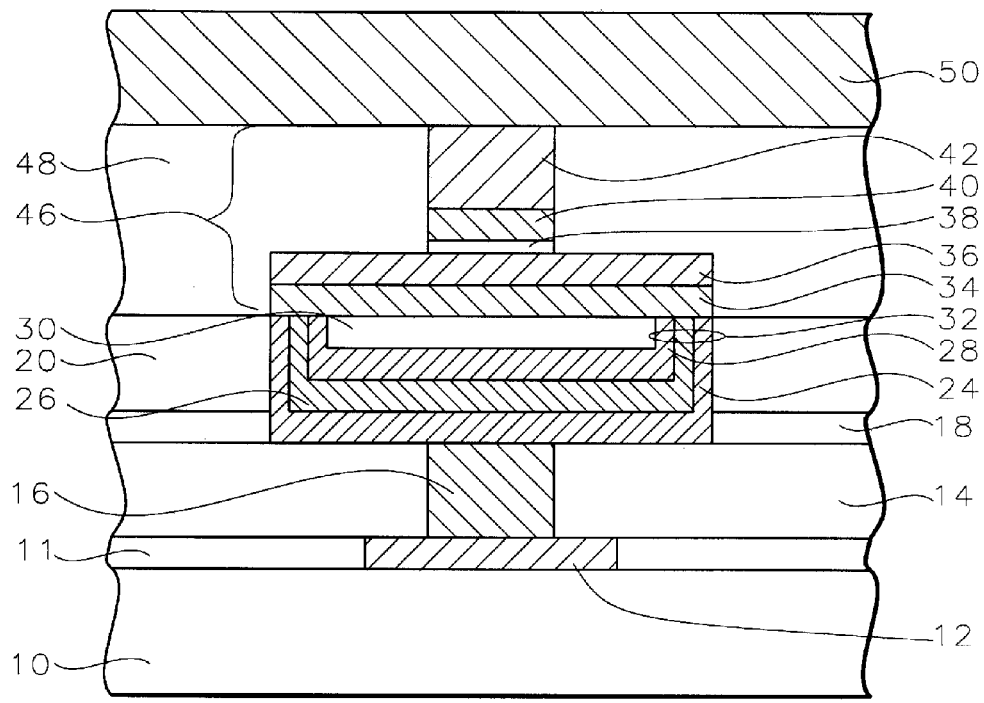
FIG. 11 is a completed device of the present disclosure.

FIG. 11 illustrates a completed device having bit line 50 contacting the top of MTJ element 46. Dielectric layer 48 surrounds MTJ element 46 and contact ring 32. MTJ element 46 electrically contacts the metal ring 24/26/28 of the contact ring 32. The contact ring 32 provides electrical connection between the CMOS device 12 and the MTJ device 46.

The present disclosure provides a new process integration for spin torque MRAM products. The method allows one to build a magnetic device on top of a dielectric material or other special materials in the center of a contact ring, which benefits magnetic performance. The advantages of the present disclosure include improved thermal stability (higher Hc) and lower offset magnetic field (lower $H_o$).

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method of fabricating a magnetic random access memory device comprising:
   providing a metal contact to a CMOS landing pad in a substrate and covering said metal contact with a dielectric layer;
   opening a via in said dielectric layer thereby exposing said metal contact;
   forming a metal ring contact in said via wherein a filling layer is formed in a center of said metal ring and wherein a bottom of said metal ring contact underlying said filling layer is metal; and
   providing a magnetic tunnel junction (MTJ) structure on said metal ring contact.

2. The method according to claim 1 wherein said magnetic random access memory device comprises an in-plane or out-of-plane spin-torque-transfer random access memory device, a spin value read head or sensor, or other spintronic device.

3. The method according to claim 1 wherein said dielectric layer comprises a first layer of silicon nitride having a thickness of between about 300 and 500 Angstroms and a second layer of silicon dioxide over said first layer having a thickness of between about 1000 and 3000 Angstroms.

4. The method according to claim 1 wherein forming a metal ring contact further comprises:
   opening a via in said dielectric layer thereby exposing said metal contact;
   depositing a metal film conformally within said opening;
   depositing a filling layer over said metal film; and
   polishing said filling layer and said metal film, leaving said metal film only within said opening and leaving said filling layer overlying said metal film at the bottom of said opening filling all space within sidewalls of said metal film within said opening thereby forming a metal ring contact having said filling layer in a center of said metal ring.

5. The method according to claim 4 wherein depositing a metal film comprises depositing a single layer metal film or a multiple layer metal film.

6. The method according to claim 4 wherein depositing a metal film further comprises:
   depositing a first tantalum layer in said opening;
   depositing a copper layer over said tantalum layer; and
   depositing a second tantalum layer over said copper layer.

7. The method according to claim 4 wherein a thickness of said metal film is more than about 1000 Angstroms thinner than a thickness of said dielectric layer.

8. The method according to claim 4 wherein said polishing comprises chemical mechanical polishing.

9. The method according to claim 1 wherein said filling material is a dielectric layer or conductive or non-conductive composite materials that can provide a smooth surface for MTJ deposition.

10. The method according to claim 1 wherein a bottom-most conducting layer of said MTJ electrically contacts said metal ring.

11. A method of fabricating a magnetic random access memory device comprising:
providing a metal contact to a CMOS landing pad in a substrate and covering said metal contact with a dielectric layer;
opening a via in said dielectric layer thereby exposing said metal contact;
depositing a metal film conformally within said opening;
depositing a filling layer over said metal film;
polishing said filling layer and said metal film, leaving said metal film only within said opening and leaving said filling layer overlying said metal film at the bottom of said opening filling all space within sidewalls of said metal film within said opening thereby forming a metal ring contact having said filling layer in a center of said metal ring;
providing a magnetic tunnel junction (MTJ) structure over said metal ring contact wherein said MTJ structure electrically contacts said metal ring contact; and
forming a bit line over said MTJ.

12. The method according to claim 11 wherein said magnetic random access memory device comprises an in-plane or out-of-plane spin-torque-transfer random access memory device, a spin value read head or sensor, or other spintronic device.

13. The method according to claim 11 wherein said dielectric layer comprises a first layer of silicon nitride having a thickness of between about 300 and 500 Angstroms and a second layer of silicon dioxide over said first layer having a thickness of between about 1000 and 3000 Angstroms.

14. The method according to claim 11 wherein depositing a metal film comprises depositing a single layer metal film or a multiple layer metal film.

15. The method according to claim 11 wherein depositing a metal film further comprises:
depositing a first tantalum layer in said opening;
depositing a copper layer over said tantalum layer; and
depositing a second tantalum layer over said copper layer.

16. The method according to claim 11 wherein a thickness of said metal film is more than about 1000 Angstroms thinner than a thickness of said dielectric layer.

17. The method according to claim 11 wherein said filling material is a dielectric layer or conductive or non-conductive composite materials that can provide a smooth surface for MTJ deposition.

18. A spin-torque-transfer magnetic random access memory device comprising:
a metal contact to a CMOS landing pad in a substrate;
a metal ring contact on said metal contact wherein a filling layer is formed in a center of said metal ring and wherein a bottom of said metal ring contact underlying said filling layer is metal; and
a magnetic tunnel junction over said CMOS landing pad and connected to said CMOS landing pad by said metal ring contact.

19. The device according to claim 18 wherein said metal ring contact comprises a single layer metal film or a multiple layer metal film and wherein said filling material is a dielectric layer or conductive or non-conductive composite materials that can provide a smooth surface for MTJ deposition.

20. The device according to claim 19 wherein said multiple layer metal film comprises:
a first tantalum layer comprising said bottom of said metal ring contact and outside of said metal ring;
a copper layer over said tantalum layer; and
a second tantalum layer over said copper layer.

* * * * *